United States Patent
Yuwaki et al.

(10) Patent No.: US 11,996,673 B2
(45) Date of Patent: May 28, 2024

(54) DRIVE DEVICE AND LIGHT EMITTING DEVICE

(71) Applicant: Sony Semiconductor Solutions Corporation, Kanagawa (JP)

(72) Inventors: Takeshi Yuwaki, Kumamoto (JP); Mitsushi Tabata, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 548 days.

(21) Appl. No.: 17/290,006

(22) PCT Filed: Oct. 18, 2019

(86) PCT No.: PCT/JP2019/041007
§ 371 (c)(1),
(2) Date: Apr. 29, 2021

(87) PCT Pub. No.: WO2020/110504
PCT Pub. Date: Jun. 4, 2020

(65) Prior Publication Data
US 2022/0006258 A1   Jan. 6, 2022

(30) Foreign Application Priority Data

Nov. 27, 2018   (JP) .................................. 2018-221582

(51) Int. Cl.
*H01S 5/02325*   (2021.01)
*H01S 5/0239*   (2021.01)
(Continued)

(52) U.S. Cl.
CPC ........ *H01S 5/02325* (2021.01); *H01S 5/0239* (2021.01); *H01S 5/06808* (2013.01); *H01S 5/423* (2013.01); *H01S 5/042* (2013.01)

(58) Field of Classification Search
CPC ............... H01S 5/42–426; H01S 5/423; H01S 5/06808; H01S 5/042–0428
See application file for complete search history.

(56) References Cited

U.S. PATENT DOCUMENTS 5,459,328 A * 10/1995 Kadota ................... H05B 47/23
250/214 A
5,793,786 A *  8/1998 Furumiya ............... H01S 5/042
372/38.02

(Continued)

FOREIGN PATENT DOCUMENTS

| CN | 102637417 A | 8/2012 |
| CN | 102738700 A | 10/2012 |

(Continued)

OTHER PUBLICATIONS

Extended European Search Report dated Nov. 17, 2021 for corresponding European Application No. 19889557.5.

(Continued)

*Primary Examiner* — Joshua King
(74) *Attorney, Agent, or Firm* — Michael Best & Friedrich LLP

(57) ABSTRACT

A drive device according to the present disclosure includes a drive circuit (10) and a detection circuit (20). The drive circuit (10) drives a plurality of channels on an individual basis. The plurality of channels includes a plurality of light emitting elements (5). The detection circuit (20) collectively detects abnormalities of all the channels. Further, the drive device (10) is electrically and mechanically connected, with a plurality of microbumps (4), to a light emitting element array that includes the plurality of light emitting elements (5).

7 Claims, 4 Drawing Sheets

(51) Int. Cl.
*H01S 5/042* (2006.01)
*H01S 5/068* (2006.01)
*H01S 5/42* (2006.01)

(56) References Cited

U.S. PATENT DOCUMENTS

| | | | | |
|---|---|---|---|---|
| 5,796,714 | A * | 8/1998 | Chino | H01S 5/18305 |
| | | | | 372/96 |
| 5,966,394 | A * | 10/1999 | Spurr | H01S 5/042 |
| | | | | 372/34 |
| 6,005,262 | A * | 12/1999 | Cunningham | H01S 5/02325 |
| | | | | 257/435 |
| 6,388,322 | B1 | 5/2002 | Goossen et al. | |
| 6,456,641 | B1 * | 9/2002 | Hauer | H01S 5/0239 |
| | | | | 372/38.07 |
| 6,458,411 | B1 | 10/2002 | Goossen et al. | |
| 6,854,901 | B1 | 2/2005 | Ouchi | |
| 7,282,776 | B2 * | 10/2007 | Gorrell | H01L 23/48 |
| | | | | 257/E23.002 |
| 8,018,170 | B2 * | 9/2011 | Chen | H05B 45/325 |
| | | | | 315/192 |
| 8,729,870 | B2 * | 5/2014 | Crawford | H05B 45/3725 |
| | | | | 323/272 |
| 8,837,539 | B1 * | 9/2014 | Sun | H01S 5/06832 |
| | | | | 372/38.07 |
| 9,300,113 | B2 * | 3/2016 | Hoffman | H01S 5/0428 |
| 9,370,082 | B2 * | 6/2016 | Yoneoka | H05B 45/58 |
| 9,570,883 | B2 * | 2/2017 | Zarbock | G02B 6/4269 |
| 9,876,328 | B1 * | 1/2018 | Wappis | H05B 45/10 |
| 2003/0039280 | A1 * | 2/2003 | Mangano | H01S 5/0428 |
| | | | | 372/38.02 |
| 2003/0189961 | A1 * | 10/2003 | Tsuji | H01S 5/042 |
| | | | | 372/38.02 |
| 2003/0205949 | A1 * | 11/2003 | Rueger | F02D 41/221 |
| | | | | 310/316.03 |
| 2005/0058389 | A1 * | 3/2005 | Ouchi | G02B 6/4292 |
| | | | | 385/14 |
| 2007/0116075 | A1 * | 5/2007 | Fujita | G11B 7/126 |
| 2007/0241354 | A1 * | 10/2007 | Tanaka | H01S 5/04257 |
| | | | | 257/E33.001 |
| 2008/0048567 | A1 * | 2/2008 | Steele | H04N 1/40056 |
| | | | | 315/151 |
| 2008/0253418 | A1 * | 10/2008 | Egawa | H04N 9/3129 |
| | | | | 372/38.02 |
| 2011/0227489 | A1 * | 9/2011 | Huynh | H05B 45/14 |
| | | | | 315/185 R |
| 2012/0033692 | A1 * | 2/2012 | Schleuning | H01S 5/041 |
| | | | | 372/75 |
| 2012/0212143 | A1 * | 8/2012 | Esaki | H05B 45/52 |
| | | | | 315/192 |
| 2013/0293122 | A1 * | 11/2013 | Huynh | H05B 45/59 |
| | | | | 315/185 R |
| 2014/0211192 | A1 * | 7/2014 | Grootjans | H02M 7/42 |
| | | | | 356/5.01 |
| 2014/0265839 | A1 * | 9/2014 | Anand | H05B 45/58 |
| | | | | 315/77 |
| 2014/0269799 | A1 * | 9/2014 | Ortiz | H01S 5/0428 |
| | | | | 372/38.02 |
| 2014/0269804 | A1 * | 9/2014 | Lai | G02B 6/4206 |
| | | | | 372/50.21 |
| 2015/0053163 | A1 * | 2/2015 | Bolz | F02P 23/04 |
| | | | | 372/38.03 |
| 2015/0327338 | A1 * | 11/2015 | Hui | H05B 45/46 |
| | | | | 323/317 |
| 2017/0162128 | A1 * | 6/2017 | Kimura | G09G 3/342 |
| 2017/0170339 | A1 | 6/2017 | Ootorii et al. | |
| 2017/0214374 | A1 * | 7/2017 | Tajalli | H03G 3/3089 |
| 2017/0219647 | A1 | 8/2017 | Yun et al. | |
| 2017/0371363 | A1 | 12/2017 | Habu et al. | |
| 2018/0191306 | A1 * | 7/2018 | Ivanov | H03F 3/45475 |
| 2018/0278011 | A1 * | 9/2018 | Galvano | G01S 7/4813 |

FOREIGN PATENT DOCUMENTS

| | | | | |
|---|---|---|---|---|
| CN | 105186289 | A | 12/2015 | |
| CN | 105759369 | B * | 3/2018 | G02B 6/3895 |
| CN | 105027678 | B * | 7/2018 | G05F 3/16 |
| CN | 112805888 | A | 5/2021 | |
| DE | 19618010 | C1 * | 7/1997 | B60Q 1/38 |
| DE | 102016226260 | A1 * | 6/2017 | B60Q 1/34 |
| EP | 2866526 | A1 * | 4/2015 | H05B 33/083 |
| JP | 08-153935 | A | 6/1996 | |
| JP | 2001-42170 | A | 2/2001 | |
| JP | 2001068795 | A * | 3/2001 | B41J 2/45 |
| JP | 2006-218290 | A | 8/2006 | |
| JP | 2006218290 | A * | 8/2006 | |
| JP | 2006-278403 | A | 10/2006 | |
| JP | 2006278403 | A * | 10/2006 | |
| JP | 2011-199079 | A | 10/2011 | |
| JP | 2011198739 | A | 10/2011 | |
| JP | 2011199079 | A * | 10/2011 | |
| JP | 2013-131348 | A | 7/2013 | |
| JP | 2013131348 | A * | 7/2013 | |
| JP | 2014-86363 | A | 5/2014 | |
| JP | 2017-56854 | A | 3/2017 | |
| JP | 2017056854 | A * | 3/2017 | |
| JP | 2017208195 | A * | 11/2017 | G01R 31/02 |
| JP | 2018-5323 | A | 1/2018 | |
| KR | 102499936 | B1 * | 2/2023 | |
| TW | 201419245 | A * | 5/2014 | H05B 33/0824 |
| TW | 201426239 | A * | 7/2014 | G05F 3/16 |
| WO | WO-03026082 | A2 * | 3/2003 | G02B 19/0014 |
| WO | WO-03061347 | A1 * | 7/2003 | H05B 33/0803 |
| WO | WO-2012007309 | A1 * | 1/2012 | H01S 5/4093 |
| WO | WO-2014078998 | A1 * | 5/2014 | G05F 3/16 |
| WO | WO-2014208048 | A1 * | 12/2014 | H01S 5/06825 |
| WO | WO-2015145742 | A1 * | 10/2015 | H01S 5/042 |
| WO | 2015174239 | A1 | 4/2017 | |
| WO | WO-2017154128 | A1 * | 9/2017 | H01S 5/0021 |

OTHER PUBLICATIONS

International Search Report (PCT/ISA/210), International Application No. PCT/JP2019/041007, dated Dec. 17, 2019.
Notification of Transmittal of the International Search Report and the Written Opinion of the International Searching Authority, or the Declaration (PCT/ISA/220), International Application No. PCT/JP2019/041007, dated Jan. 7, 2020.
Written Opinion of the International Search Authority (PCT/ISA/237), International Application No. PCT/JP2019/041007, dated Jan. 7, 2020.

* cited by examiner

DRIVE DEVICE AND LIGHT EMITTING DEVICE

TECHNICAL FIELD

The present disclosure relates to a drive device and a light emitting device.

BACKGROUND ART

A multi-channel light emitting device including a large number of (e.g., several hundred) light emitting elements, such as a Vertical Cavity Surface Emitting Laser (VCSEL), is well known in recent years (refer, for example, to PTL 1).

CITATION LIST

Patent Literature

[PTL 1]
PCT Patent Publication No. WO2015/174239

SUMMARY

Technical Problem

However, in a case where an attempt is made to use microbumps for connecting a VCSEL chip to a driver chip that drives a large number of light emitting elements, it is difficult for the above-mentioned conventional technology to enable a single driver chip to determine whether or not the circuits of all the channels are normal. The reason is that microbump connection pads to be attached to the driver chip are small. This makes it difficult to bring a test probe into proper contact with such connection pads.

In view of the above circumstances, the present disclosure proposes a drive device and a light emitting device that enable even a single driver chip to determine whether or not the circuits of all the channels are normal.

Solution to Problem

The present disclosure provides a drive device. The drive device includes a drive circuit and a detection circuit. The drive circuit drives a plurality of channels on an individual basis. The plurality of channels includes a plurality of light emitting elements. The detection circuit collectively detects abnormalities of all the channels. Further, the drive device is electrically and mechanically connected, with a plurality of microbumps, to a light emitting element array that includes the plurality of light emitting elements.

Advantageous Effect of Invention

The present disclosure enables even a single driver chip to determine whether or not the circuits of all the channels are normal. It should be noted that the advantages described here are not necessarily restrictive. The present disclosure may provide any advantages described in this document.

DESCRIPTION OF EMBODIMENT

Figure 1:
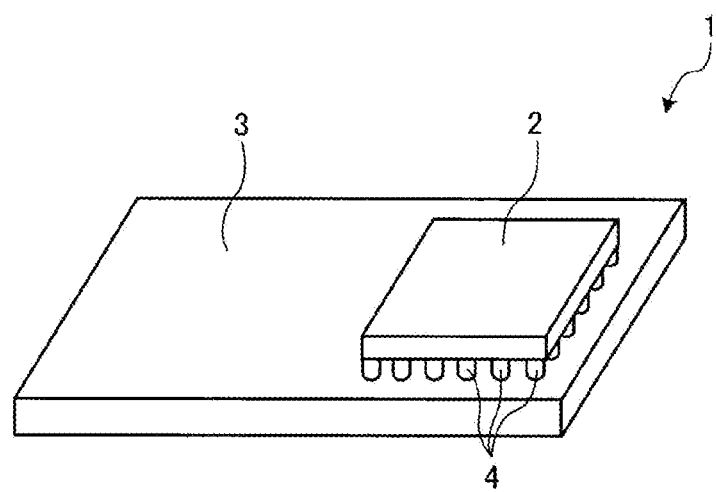
FIG. 1 is a perspective view illustrating a configuration example of a light emitting device according to an embodiment of the present disclosure.

An embodiment of the present disclosure will now be described in detail with reference to the accompanying drawings. It should be noted that, in the following description of the embodiment, identical elements are designated by the same reference numerals and will not be redundantly described.

Configuration of Light Emitting Device

FIG. 1 is a perspective view illustrating a configuration example of a light emitting device 1 according to the embodiment of the present disclosure. As depicted in FIG. 1, the light emitting device 1 includes a VCSEL chip 2 and a driver chip 3. It should be noted that, in the embodiment of the present disclosure, the VCSEL chip 2 is an example of a light emitting element array, and the driver chip 3 is an example of a drive device.

Figure 4:
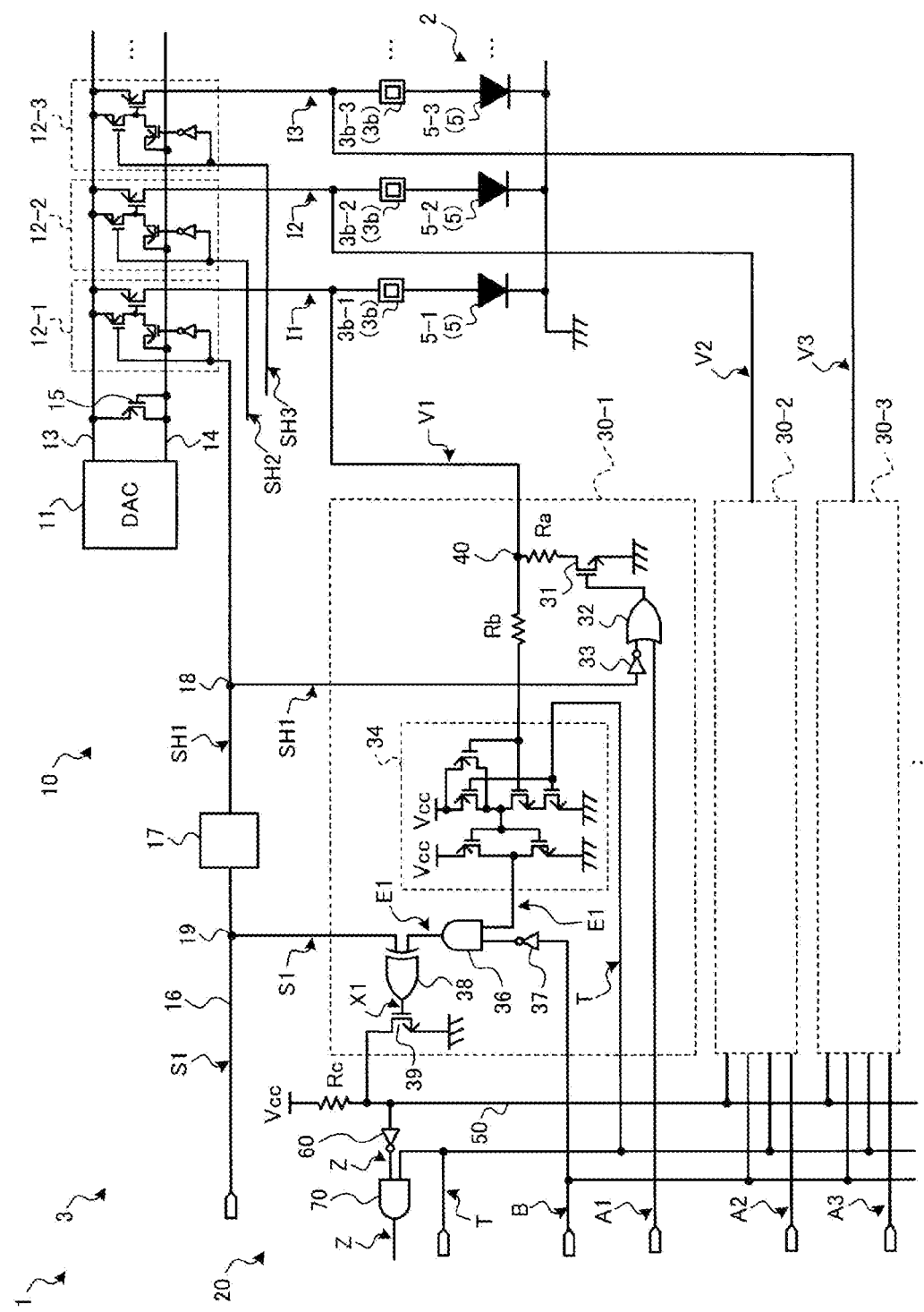
FIG. 4 is a circuit diagram illustrating an example of a driver chip operation performed in a case where the VCSEL chip is incorporated in the embodiment of the present disclosure.

The VCSEL chip 2 includes a plurality of light emitting elements 5 (see FIG. 4). Further, in the VCSEL chip 2, a plurality of channels is formed by the plurality of the light emitting elements 5. Each of the light emitting elements 5 disposed in the VCSEL chip 2 may be, for example, a semiconductor laser, and more specifically, a vertical cavity surface emitting laser (VCSEL). It should be noted that, in the embodiment, the light emitting elements 5 disposed in the VCSEL chip 2 are not limited to such an example.

Figure 3:
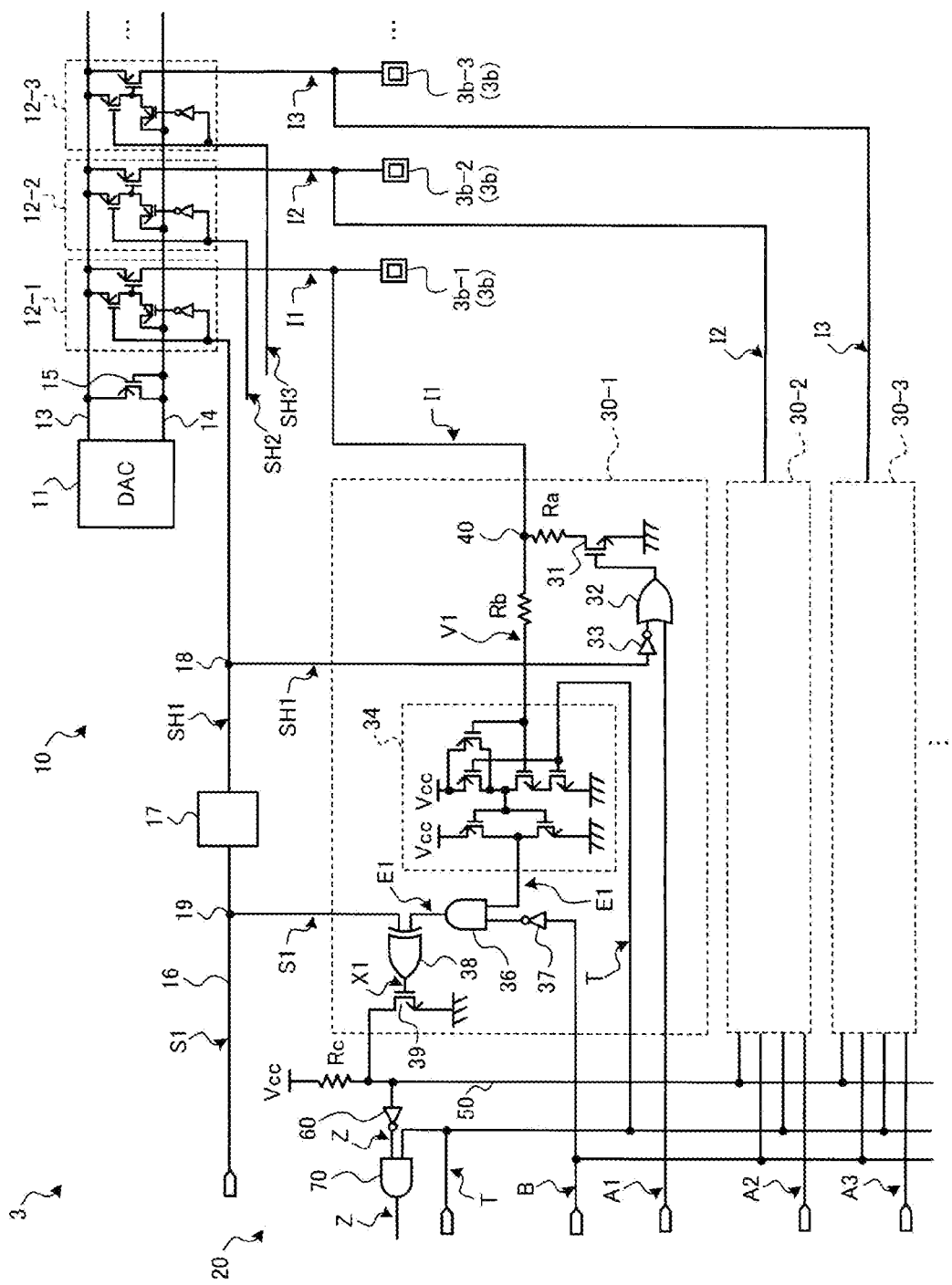
FIG. 3 is a circuit diagram illustrating a configuration example of the driver chip according to the embodiment of the present disclosure.

The driver chip 3 includes a drive circuit 10 (see FIG. 3) and a detection circuit 20 (see FIG. 3). The drive circuit 10 drives all the channels in the VCSEL chip 2 on an individual basis. The detection circuit 20 detects whether or not all the channels are normal. The internal configuration of the driver chip 3 will be described later.

Further, in the light emitting device 1 according to the embodiment, the VCSEL chip 2 is incorporated on the upper surface 3a (see FIG. 2A) of the driver chip 3. Furthermore, the VCSEL chip 2 and the driver chip 3 are electrically and mechanically connected to each other with a plurality of microbumps 4.

Figure 2A:
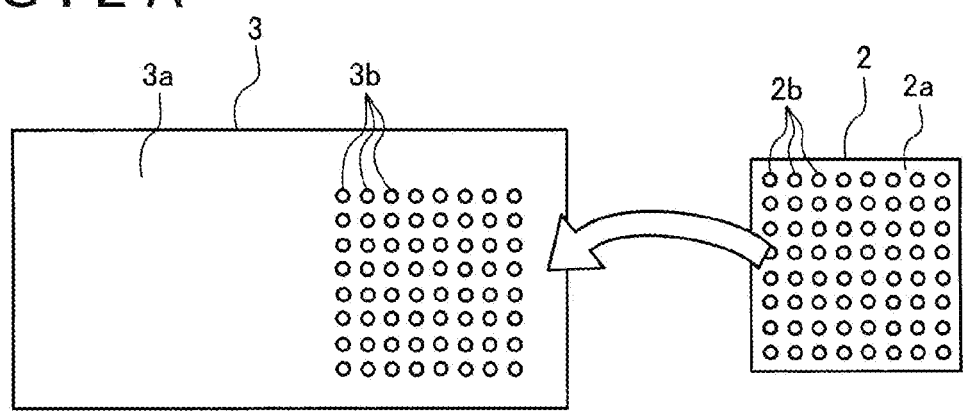
FIG. 2A is a top view illustrating a configuration example of a VCSEL chip and a driver chip according to the embodiment of the present disclosure.

FIG. 2A is a top view illustrating a configuration example of the VCSEL chip 2 and the driver chip 3 according to the embodiment of the present disclosure. As depicted in FIG. 2A, a plurality of connection pads 2b is disposed on a bottom surface 2a of the VCSEL chip 2. Further, a plurality of connection pads 3b is disposed on the upper surface 3a of the driver chip 3. The plurality of connection pads 3b is disposed at positions corresponding to the positions of the plurality of connection pads 2b of the VCSEL chip 2.

Figure 2B:
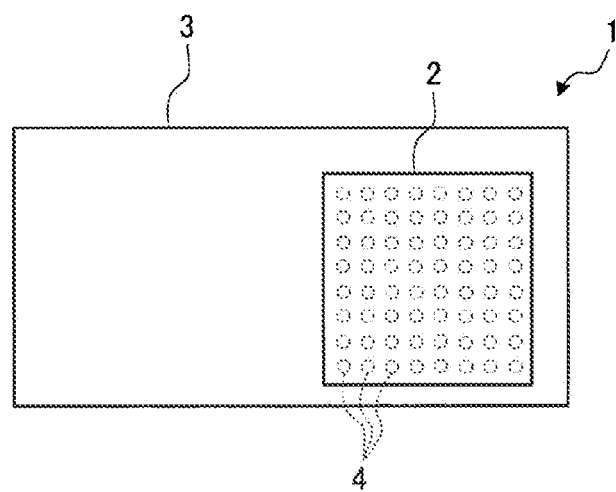
FIG. 2B is a top view illustrating a configuration example of the light emitting device according to the embodiment of the present disclosure.

Moreover, when the connection pads 2b and the connection pads 3b are positioned to face each other and electrically and mechanically connected to each other with the microbumps 4, the light emitting device 1 according to the embodiment is formed as depicted in FIG. 2B. FIG. 2B is a top view illustrating a configuration example of the light emitting device 1 according to the embodiment of the present disclosure.

It should be noted that microbump is a technology for electrically and mechanically connecting the connection pads of two chips with a metal bump smaller than a conventional solder ball (e.g., a metal bump having a diameter of several micrometers to several tens of micrometers). This technology enables the driver chip 3 to drive the VCSEL chip 2 having a large number of channels.

Configuration of Driver Chip

Subsequently, a detailed configuration of the driver chip 3 will now be described with reference to FIG. 3. FIG. 3 is a circuit diagram illustrating a configuration example of the driver chip 3 according to the embodiment of the present disclosure. As depicted in FIG. 3, the driver chip 3 includes a drive circuit 10 and a detection circuit 20.

It should be noted that, for ease of understanding, configurations of channels CH1 to CH3, which are among a total of n (e.g., 800) channels (hereinafter referred to also as CHs) provided for the driver chip 3, are depicted in the later-referenced examples of FIGS. 3 and 4. Further, although the following description mainly deals with the detection circuit 20 of CH1, the configurations of CH2 to CHn are similar to the configuration of CH1.

The drive circuit 10 includes a DAC (Digital to Analog Converter) 11 and n drive sections 12-1 to 12-n, which each correspond to individual channels. The DAC 11 selects a potential difference corresponding to a gradation value given by an externally supplied digital signal, and causes the selected potential difference between an upper wiring 13 and a lower wiring 14.

Selection signals S1 to Sn are inputted to the drive sections 12-1 to 12-n from a control section that is not depicted in the drawings. The selection signals S1 to Sn selectively specify on an individual channel basis whether or not to emit light. For example, on CH1, the selection signal from the control section is sent through a signal line 16.

Subsequently, each of the selection signals S1 to Sn is level-shifted in a level shift circuit 17 so as to obtain selection signals SH1 to SHn. The selection signals SH1 to SHn are then sent to the drive sections 12 corresponding to the individual channels.

For example, in the embodiment, the selection signals S1 to Sn are signals of 0 to 1.1 (V), and the selection signals SH1 to SHn are signals of 0 to 3.3 (V). Further, in a case where the selection signals S1 to Sn are at a high level, light emission is selected by the control section. Meanwhile, in a case where the selection signals S1 to Sn are at a low level, light emission is not selected.

As depicted in FIG. 3, the drive section 12-1 includes three P-type transistors and one NOT circuit. Based on the above level-shifted selection signal SH1, the drive section 12-1 supplies a predetermined operating current I1 to the connection pad 3b-1, which is the connection pad 3b for CH1.

In the embodiment, a current mirror circuit is formed by the drive section 12-1 and the P-type transistors 15 disposed between the upper wiring 13 and the lower wiring 14. Further, when a high-level selection signal SH1 is inputted to the drive section 12-1, the drive section 12-1 is able to supply, to the connection pad 3b-1, the operating current I1 based on the potential difference generated by the DAC 11.

It should be noted that the example in FIG. 3 depicts a case where the light emitting elements 5 are connected to none of the connection pads 3b (i.e., a case where the driver chip 3 without the VCSEL chip 2, that is, a single driver chip 3, is adopted).

The detection circuit 20 includes n detection sections 30-1 to 30-n (hereinafter, generically referred also to as the detection sections 30) which each correspond to the individual channels, a common wiring 50, a NOT circuit 60, and an AND circuit 70.

The detection section 30-1 corresponding to CH1 includes an N-type transistor 31, an OR circuit 32, a NOT circuit 33, a logic circuit 34, an AND circuit 36, a NOT circuit 37, an exclusive OR circuit 38, and an N-type transistor 39. It should be noted that, in the embodiment of the present disclosure, the N-type transistor 31 is an example of a shunt switch, and the AND circuit 36 is an example of a test AND circuit.

The drain of the N-type transistor 31 is connected to a node 40 through a pseudo-resistor Ra. The node 40 is connected between the drive section 12-1 and the connection pad 3b-1, and connected to the input side of the logic circuit 34 through a resistor Rb. The source of the N-type transistor 31 is grounded. That is, the pseudo-resistor Ra and the N-type transistor 31 acting as a shunt switch are series-connected between the node 40 and the ground.

Further, an output signal from the OR circuit 32 is inputted to the gate of the N-type transistor 31. The OR circuit 32 receives an input of a signal A1 from the control section, and additionally receives, through the NOT circuit 33, an input of the selection signal SH1 which is branched from a node 18 of the signal line 16.

Here, in the example depicted in FIG. 3, the single driver chip 3 is adopted as mentioned above. In a case where CH1 light emission is selected in the embodiment while the single driver chip 3 is adopted as mentioned above, the detection section 30-1 internally generates, in a pseudo-manner, an operating voltage V1 that arises in the light emitting elements 5. More specifically, the pseudo-resistor Ra and the N-type transistor 31 are used to generate the operating voltage V1 in the detection section 30-1 in a pseudo-manner.

In a case where the single driver chip 3 is adopted, the control section inputs high-level signals A1 to An to the OR circuit 32 in all the detection sections 30. This causes the OR circuit 32 to output high-level signals. Therefore, the N-type transistors 31 in all the detection sections 30 go into conduction so that the drive sections 12 of all the channels are grounded through the pseudo-resistor Ra.

For example, in a case where a high-level selection signal S1 is inputted to the drive section 12-1 of CH1, the drive section 12-1 supplies a predetermined operating current I1 to the connection pad 3b-1. In this case, while nothing is connected to the connection pad 3b-1, the drive section 12-1 is grounded through the pseudo-resistor Ra.

Consequently, the operating current I1 flows to the pseudo-resistor Ra so that the operating voltage V1 is generated in a pseudo-manner at the node 40 upstream of the pseudo-resistor Ra. Subsequently, the operating voltage V1 is inputted to the logic circuit 34. For example, in a case where the single driver chip 3 is adopted, the operating voltage V1 generated in a pseudo-manner is substantially equal to a power supply voltage Vcc (e.g., 3.3 V).

As depicted in FIG. 3, the logic circuit 34 includes three N-type transistors and three P-type transistors. The logic circuit 34 includes an AND section and a comparison section. The AND section functions as an AND circuit. The comparison section includes a plurality of inverter circuits (two inverter circuits in the example of FIG. 3) and functions as a comparator circuit.

The AND section of the logic circuit 34 receives not only an input of the operating voltage V1, but also an input of a signal T from the control section. The signal T reaches a high level when the circuits of all the channels formed in the driver chip 3 are to be checked for abnormalities (i.e., in a case where an abnormality detection mode is enabled).

Then, in a case where the abnormality detection mode is enabled, the comparison section of the logic circuit 34 is able to operate as a comparator circuit, use one-half the power supply voltage Vcc as a threshold voltage, and compare an input voltage (the operating voltage V1 in this instance) with the threshold voltage. For example, in a case where a high-level selection signal S1 is inputted and the operating current I1 is supplied from the drive section 12-1, the operating voltage V1 is equal to or higher than the threshold voltage. Therefore, the logic circuit 34 generates a high-level detection signal E1.

Meanwhile, in a case where a low-level selection signal S1 is inputted and the operating current I1 is not supplied from the drive section 12-1, the operating voltage V1 is lower than the threshold voltage. Therefore, the logic circuit 34 generates a low-level detection signal E1.

Stated differently, the comparison section of the logic circuit 34 has the same function as a comparator. When the comparison section of the logic circuit 34 is formed by a plurality of inverter circuits, the resulting circuit configuration is simpler than that of a comparator. Consequently, the embodiment makes it possible to reduce the manufacturing cost of the driver chip 3. It should be noted that, in the embodiment, the comparison section of the logic circuit 34 may be configured as a comparator.

The detection signal E1 outputted from the logic circuit 34 is inputted to the AND circuit 36. The AND circuit 36 receives not only an input of the detection signal E1, but also an input of a test signal B from the control section through the NOT circuit 37. The test signal B is disabled (i.e., reaches a low level) in a regular abnormality detection mode. Processing performed by using the test signal B will be described later in detail.

Further, as the test signal B is at a low level in the regular abnormality detection mode, the test signal B converted from a low level to a high level is inputted to the AND circuit 36 through the NOT circuit 37. In the regular abnormality detection mode, therefore, the detection signal E1 is outputted as is from the AND circuit 36, and then inputted to the exclusive OR circuit 38.

The exclusive OR circuit 38 receives not only an input of the detection signal E1, but also an input of the selection signal S1 branched from a node 19 of the signal line 16. Then, the exclusive OR circuit 38 outputs a determination signal X1 in accordance with the inputted detection signal E1 and the selection signal S1.

For example, in a case where the selection signal S1 is at a high level (i.e., CH1 light emission is selected) and the detection signal E1 is at a high level (i.e., the operating voltage V1 is high), the exclusive OR circuit 38 outputs a low-level determination signal X1.

Similarly, in a case where the selection signal S1 is at a low level (i.e., CH1 light emission is not selected) and the detection signal E1 is at a low level (i.e., the operating voltage V1 is low), the exclusive OR circuit 38 outputs the low-level determination signal X1.

Meanwhile, in a case where the selection signal S1 is at the high level (i.e., CH1 light emission is selected) and the detection signal E1 is at the low level (i.e., the operating voltage V1 is low), the exclusive OR circuit 38 outputs a high-level determination signal X1.

Similarly, in a case where the selection signal S1 is at the low level (i.e., CH1 light emission is not selected) and the detection signal E1 is at the high level (i.e., the operating voltage V1 is high), the exclusive OR circuit 38 outputs the high-level determination signal X1.

Stated differently, in a case where the drive section 12-1 and other CH1 circuits are normal and the detection signal E1 agrees with the selection signal S1, the exclusive OR circuit 38 outputs the low-level determination signal X1. Meanwhile, in a case where the drive section 12-1 or other CH1 circuit is abnormal and the detection signal E1 disagrees with the selection signal S1, the exclusive OR circuit 38 outputs the high-level determination signal X1.

As described above, the embodiment uses the exclusive OR circuit 38 to determine whether or not the detection signal E1 agrees with the selection signal S1. This makes it easy to detect whether or not the CH1 circuits in the driver chip 3 are normal.

Similarly, the embodiment uses the exclusive OR circuit 38 in the detection sections 30 corresponding to the individual channels in order to determine whether or not the detection signals E2 to En of CH2 to CHn respectively agree with the selection signals S2 to Sn. This makes it easy to detect whether or not the CH2 to CHn circuits in the driver chip 3 are each normal.

The determination signal X1 outputted from the exclusive OR circuit 38 is inputted to the gate of the N-type transistor 39. The drain of the N-type transistor 39 is connected to the common wiring 50, and the source of the N-type transistor 39 is grounded. The power supply voltage Vcc is supplied to the common wiring 50 through a resistor Rc. Further, the N-type transistors 39 in the detection sections 30 corresponding to the individual channels are commonly connected to the common wiring 50.

Moreover, the input terminal of the NOT circuit 60 is connected to the common wiring 50 downstream of the resistor Rc, and a collective determination signal Z outputted from the NOT circuit 60 is inputted to the AND circuit 70.

Here, in a case where the circuits of all the channels are normal and all the determination signals X1 to Xn are at a low level, the common wiring 50 remains ungrounded (i.e., reaches a high level). Therefore, the NOT circuit 60 outputs a low-level collective determination signal Z.

Meanwhile, in a case where any one of all the channels is abnormal, at least one of the determination signals X1 to Xn reaches a high level. In this instance, the common wiring 50 becomes grounded (i.e., reaches a low level). Therefore, the NOT circuit 60 outputs a high-level collective determination signal Z.

As described above, as far as the N-type transistors 39 in all the detection sections 30 are connected to the single common wiring 50, the embodiment enables the NOT circuit 60 to output the high-level collective determination signal Z in a case where any one of all the channels is abnormal.

Stated differently, the embodiment is configured such that a collective determination section for collectively determining, on the basis of the determination signals X1 to Xn, whether or not the circuits of all the channels are normal is formed by a plurality of N-type transistors 39, the common wiring 50, and the NOT circuit 60.

Further, the collective determination section has the same function as a multi-input single-output OR circuit. Meanwhile, when the collective determination section is formed by the plurality of N-type transistors 39, the common wiring 50, and the NOT circuit 60, the circuit configuration can be made simpler than that of a multi-input single-output OR circuit.

Consequently, the embodiment makes it possible to reduce the manufacturing cost of the driver chip 3. It should be noted that the collective determination section in the embodiment may be formed by a multi-input single-output OR circuit.

The AND circuit 70 receives, from the control section, an input of the signal T for enabling the abnormality detection mode, in addition to the collective determination signal Z. Accordingly, only in the case where the abnormality detection mode is enabled, the AND circuit 70 is able to output the high-level collective determination signal Z (i.e., the collective determination signal for a case where a circuit abnormality exists).

Stated differently, the embodiment is configured such that the AND circuit 70 is able to output the high-level collective determination signal Z in the case where the abnormality detection mode is enabled and any one of all the channels is abnormal. Therefore, according to the embodiment, in the case where the abnormality detection mode is enabled, the embodiment is able to collectively detect whether or not the circuits of all the channels in the driver chip 3 are normal.

The following describes the processing procedure that is performed when the detection circuit 20 according to the embodiment detects abnormalities while the single driver chip 3 is being adopted. First of all, the control section performs predetermined operations to turn ON/OFF the selection signals S1 to Sn for the individual channels and inputs the high-level signals A1 to An to the individual detection sections 30 of the detection circuit 20.

Next, after the drive sections 12 and other circuits have entered a steady state, the control section inputs a high-level signal T for enabling the abnormality detection mode to the detection circuit 20. This reduces the possibility of erroneous detection of abnormality in the circuits of the individual channels in a case, for example, where operating voltages V1 to Vn are unstable in a transient state where, for example, the driver chip 3 starts operating.

Further, when the AND circuit 36 acting as a test AND circuit is disposed so as to precede the exclusive OR circuit 38, the embodiment is able to determine whether or not the exclusive OR circuit 38 itself for generating the determination signal X1 is normal.

For example, the control section first switches the test signal B, which is to be inputted to all the channels, to a high level. When, for example, the test signal B to be inputted to CH2 is set at the high level, the test signal B converted to a low level in the NOT circuit 37 is inputted to the AND circuit 36. Therefore, the detection signal E2 outputted from the AND circuit 36 is at the low level.

Next, the control section sets the CH2 selection signal S2 to a high level, and sets all the other selection signals to a low level. This causes the CH2 selection signal S2 to disagree with the detection signal E2. Therefore, the exclusive OR circuit 38 outputs a high-level determination signal X2. Consequently, in a case where the CH2 selection signal S2 is set to the high level, the detection circuit 20 outputs the high-level collective determination signal Z.

As described above, the embodiment monitors the collective determination signal Z in a case where the test signal B to be inputted to all the channels is set to the high level and the selection signal for individual channels (e.g., CH2) is set to the high level. This makes it possible to determine whether or not the exclusive OR circuit 38 for the individual channels is normal.

For example, it is sufficient that the control section of the driver chip 3 in the embodiment is configured to be able to perform sequence processing for making the above determination on all of n channels. This can make it easy to determine whether or not the exclusive OR circuit 38 in all the detection sections 30 is normal.

Further, in a case where the single driver chip 3 is adopted to perform an abnormality detection process, the embodiment is able to supply an accurate power supply voltage Vcc for testing to the driver chip 3. This increases the accuracy of the threshold voltage for the logic circuit 34, which is generated based on the power supply voltage Vcc. Consequently, the single driver chip 3 is able to perform the abnormality detection process with increased accuracy.

Abnormality Detection Process Performed in Case where VCSEL Chip is Incorporated The abnormality detection process performed in a case where the VCSEL chip 2 is incorporated will now be described with reference to FIG. 4. FIG. 4 is a circuit diagram illustrating an example of an operation that is performed by the driver chip 3 in a case where the VCSEL chip 2 is incorporated in the embodiment of the present disclosure. Stated differently, FIG. 4 illustrates an example of an operation that is performed in the light emitting device 1 in which the VCSEL chip 2 is incorporated on the driver chip 3.

As depicted in FIG. 4, the light emitting device 1 is configured such that a plurality of the light emitting elements 5 of the VCSEL chip 2 is each connected to a plurality of the connection pads 3b of the driver chip 3. For example, the light emitting elements 5-1 to 5-n are respectively connected to the connection pads 3b-1 to 3b-n.

The drive sections 12-1 to 12-n are connected to the anodes of the light emitting elements 5-1 to 5-n, which are light emitting diodes, through the connection pads 3b-1 to 3b-n. The cathodes of the light emitting elements 5-1 to 5-n are commonly grounded. That is, the embodiment is configured such that the light emitting elements 5-1 to 5-n are connected as cathode common.

From now on, for ease of understanding, the abnormality detection process performed on CH1, which is one of the plurality of channels, will be described in detail. On CH1, the operating voltage V1 of the light emitting element 5-1 is generated between the drive section 12-1 and the connection pad 3b-1 in accordance with the operating current I1 generated in the drive section 12-1. The generated operating voltage V1 has a value (e.g., 2.2 V) based, for example, on the specifications for the light emitting element 5-1, and is inputted to the detection section 30-1 of the detection circuit 20.

Here, in a case where CH1 light emission is selected and the CH1 selection signal S1 is at a high level, the selection signal SH1 level-shifted in the level shift circuit 17 is also at a high level. Therefore, a low-level signal is inputted to the OR circuit 32 through the NOT circuit 33.

Further, the embodiment is configured such that the control section inputs low-level signals A1 to An to the OR circuit 32 in all the detection sections 30 in a case where the VCSEL chip 2 is connected to the driver chip 3.

Stated differently, in a case where the VCSEL chip 2 is connected to the driver chip 3 and the CH1 selection signal S1 is at the high level, the OR circuit 32 outputs a low-level signal A1. This does not bring the N-type transistor 31 in the detection section 30-1 into conduction. As a result, the pseudo-resistor Ra remains ungrounded.

Consequently, in a case where the VCSEL chip 2 is connected to the driver chip 3 and the CH1 selection signal S1 is at the high level, the operating voltage V1 inputted to the detection section 30-1 is inputted as is to the logic circuit 34.

Moreover, in a case where the drive section 12-1 and other CH1 circuits are normal, the operating voltage V1 is high. Therefore, as is the case with the aforementioned example of FIG. 3, the detection signal E1 and the selection signal S1 inputted to the exclusive OR circuit 38 are both at a high level and agree with each other. Consequently, in the case where the drive section 12-1 and other CH1 circuits are normal, the exclusive OR circuit 38 outputs the low-level determination signal X1.

Meanwhile, in a case where the drive section 12-1 or other CH1 circuit is abnormal, the operating voltage V1 is low. Therefore, the detection signal E1 and the selection signal S1 inputted to the exclusive OR circuit 38 disagree with each other. Consequently, in the case where the drive section 12-1 or other CH1 circuit is abnormal, the exclusive OR circuit 38 outputs the high-level determination signal X1.

Further, in a case where CH1 light emission is not selected and the CH1 selection signal S1 is at a low level, the selection signal SH1 level-shifted in the level shift circuit 17 is also at a low level. Therefore, a high-level signal is inputted to the OR circuit 32 through the NOT circuit 33. This causes the OR circuit 32 to output a high-level signal. Consequently, the N-type transistor 31 in the detection section 30-1 goes into conduction. As a result, the pseudo-resistor Ra becomes grounded.

Furthermore, in the case where the drive section 12-1 and other CH1 circuits are normal, the operating current I1 does not flow so that the operating voltage V1 is low. Therefore, as is the case with the aforementioned example of FIG. 3, the detection signal E1 and the selection signal S1 inputted to the exclusive OR circuit 38 are both at a low level and agree with each other. Consequently, in the case where the drive section 12-1 and other CH1 circuits are normal, the exclusive OR circuit 38 outputs the low-level determination signal X1.

Meanwhile, in the case where the drive section 12-1 or other CH1 circuit is abnormal and a high operating current I1 flows, the high operating current I1 flows to the pseudo-resistor Ra. Therefore, a high operating voltage V1 is generated at the node 40. As a result, the detection signal E1 and the selection signal S1 inputted to the exclusive OR circuit 38 disagree with each other. Consequently, in the case where the drive section 12-1 or other CH1 circuit is abnormal, the exclusive OR circuit 38 outputs the high-level determination signal X1.

As described above, even in a case where light emission from a specific channel is not selected and a high operating current is generated on the specific channel, the embodiment is able to detect whether or not the circuits of the specific channel are normal.

Moreover, in a case where the circuits of all the channels are normal and all the determination signals X1 to Xn are at the low level, the detection circuit 20 outputs the low-level collective determination signal Z, as is the case with the aforementioned example of FIG. 3.

Meanwhile, in the case where any one of the channels is abnormal, at least one of the determination signals X1 to Xn reaches a high level. Therefore, the detection circuit 20 outputs the high-level collective determination signal Z.

As described above, as far as the abnormality detection mode is enabled, the embodiment is able to collectively detect whether or not the circuits of all the channels in the driver chip 3 are normal even in a case where the light emitting device 1 is operating.

Further, even in a case where a high operating current is generated while a circuit abnormality exists on a specific unselected channel, the embodiment is able to bypass the high operating current to the pseudo-resistor Ra. Therefore, in a case where a specific channel is not selected, the embodiment is able to inhibit the light emitting element 5 of the specific channel from erroneously emitting light.

Furthermore, as far as the AND section of the logic circuit 34 is disposed between the drive section 12 and the comparison section of the logic circuit 34, in the embodiment, the operating voltage V1 is inputted to the comparison section of the logic circuit 34 only in a case where the abnormality detection mode is enabled.

Consequently, in a case where the abnormality detection mode is disabled (i.e., the light emitting device 1 is in a normal operation mode), it is possible to inhibit the power consumption of the driver chip 3 from being increased by the operation of the comparison section of the logic circuit 34. Particularly, the embodiment is configured such that the comparison section of the logic circuit 34 is formed by a plurality of inverter circuits. Therefore, in a case where the comparison section of the logic circuit 34 operates, it consumes a relatively large amount of power. As a result, the embodiment provides a great effect of reducing the power consumption.

It should be noted that the foregoing embodiment has been described with respect to an example in which the selection signal S1 is level-shifted in the level shift circuit 17 and then inputted to the drive section 12-1. However, the selection signal S1 may be inputted as is to the drive section 12-1. In such a case, the high-level signal of the selection signal S1 is only required to be approximately equal to the power supply voltage Vcc.

Further, the foregoing embodiment may alternatively be configured such that a plurality of (e.g., sixteen) DACs 11 is disposed in each area of the VCSEL chip 2, and that a predetermined number of (e.g., fifty) drive sections 12 are connected to each DAC 11.

Furthermore, the foregoing embodiment has been described with respect to an example in which the drive sections 12 include the P-type transistors and drive a plurality of the light emitting elements 5 with commonly connected cathodes. Alternatively, the present disclosure may be configured such that the drive sections 12 include the N-type transistors and drive a plurality of the light emitting elements 5 with commonly connected anodes.

It should be noted that the advantages described in this description are merely illustrative and not restrictive. The present disclosure can provide additional advantages.

Additionally, the present technology can adopt the following configurations.

(1)
A drive device including:
a drive circuit that drives a plurality of channels on an individual basis, the plurality of channels including a plurality of light emitting elements; and
a detection circuit that collectively detects abnormalities of all the channels, in which
the drive device is electrically and mechanically connected, with a plurality of microbumps, to a light emitting element array that includes the plurality of light emitting elements.

(2)
The drive device according to (1), in which
the detection circuit includes
a plurality of pseudo-resistors that forms an internal resistance of the light emitting elements of the respective channels in a pseudo-manner, and
a plurality of shunt switches that is series-connected to the respective pseudo-resistors, and
in a case where the light emitting element array is not connected, an operating voltage of the light emitting elements of all the channels is generated in a pseudo-manner by bringing the plurality of shunt switches into conduction.

(3)
The drive device according to (2), in which
in a case where the light emitting element array is connected, the detection circuit brings the shunt switches corresponding to the channels that are not selected for light emission, into conduction.

(4)
The drive device according to (2) or (3), in which
the drive circuit includes a control section that generates a selection signal for selecting whether or not light is to be emitted from the channels, and,
the detection circuit includes an exclusive OR circuit that compares the selection signal transmitted from the control section with an output signal of each of the channels, the output signal being generated on the basis of the operating voltage of the light emitting elements.

(5)
The drive device according to (4), in which
the detection circuit includes
a plurality of the exclusive OR circuits that compares the selection signal and the output signal on an individual channel basis, and
a collective determination section that determines, on the basis of signals from all the exclusive OR circuits, whether or not all the channels are normal.

(6)
The drive device according to (4) or (5), in which
the detection circuit includes a comparison section that compares the operating voltage with a predetermined threshold voltage and generates the output signal.

(7)
The drive device according to (6), in which
the detection circuit includes a test AND circuit that is disposed between the comparison section and the exclusive OR circuit and configured to receive an input of a test signal for verifying an operation of the exclusive OR circuit.

(8)
A light emitting device including:
a light emitting element array that includes a plurality of light emitting elements; and
a drive device including a drive circuit that drives a plurality of channels on an individual basis, the plurality of channels including the plurality of light emitting elements, and a detection circuit that collectively detects abnormalities of all the channels, in which
the light emitting element array and the drive device are electrically and mechanically connected to each other with a plurality of microbumps.

(9)
The light emitting device according to (8), in which
the light emitting element array includes a Vertical Cavity Surface Emitting Laser (VCSEL).

REFERENCE SIGNS LIST

1: Light emitting device
2: VCSEL chip (an example of the light emitting element array)
3: Driver chip (an example of the drive device)
4: Microbump
5: Light emitting element
10: Drive circuit
20: Detection circuit
30: Detection section
31: N-type transistor (an example of the shunt switch)
34: Logic circuit
36: AND circuit (an example of the test AND circuit)
38: Exclusive OR circuit
50: Common wiring
Ra: Pseudo-resistor
B: Test signal

The invention claimed is:
1. A drive device comprising:
a drive circuit that drives a plurality of channels on an individual basis, the plurality of channels including a plurality of light emitting elements; and
a detection circuit that collectively detects abnormalities of all the channels, the detection circuit including a plurality of pseudo-resistors that forms an internal resistance of the light emitting elements of the respective channels in a pseudo-manner, and the detection circuit including a plurality of shunt switches that is series-connected to the respective pseudo-resistors, wherein
the drive device is electrically and mechanically connected, with a plurality of microbumps, to a light emitting element array that includes the plurality of light emitting elements,
in a case where the light emitting element array is not connected, an operating voltage of the light emitting elements of all the channels is generated in a pseudo-manner by bringing the plurality of shunt switches into conduction,
the drive circuit includes a control section that generates a selection signal for selecting whether or not light is to be emitted from the channels, and
the detection circuit includes an exclusive OR circuit that compares the election signal transmitted from the control section with an output signal of each of the channels, the output signal being generated on a basis of the operating voltage of the light emitting element.

2. The drive device according to claim 1, wherein
in a case where the light emitting element array is connected, the detection circuit brings the shunt switches corresponding to the channels that are not selected for light emission, into conduction.

3. The drive device according to claim 1, wherein
the detection circuit includes
a plurality of the exclusive OR circuits that compares the selection signal and the output signal on an individual channel basis, and
a collective determination section that determines, on a basis of signals from all the exclusive OR circuits, whether or not all the channels are normal.

4. The drive device according to claim 1, wherein
the detection circuit includes a comparison section that compares the operating voltage with a predetermined threshold voltage and generates the output signal.

5. The drive device according to claim 4, wherein
the detection circuit includes a test AND circuit that is disposed between the comparison section and the exclusive OR circuit and configured to receive an input of a test signal for verifying an operation of the exclusive OR circuit.

6. A light emitting device comprising:

a light emitting element array that includes a plurality of light emitting elements; and a drive device including a drive circuit that drives a plurality of channels on an individual basis, the plurality of channels including the plurality of light emitting elements, and a detection circuit that collectively detects abnormalities of all the channels, the detections circuit including a plurality of pseudo-resistors that forms an internal resistance of the light emitting elements of the respective channels in a pseudo-manner, and the detection circuit including a plurality of shunt switches that is series-connected to the respective pseudo-resistors, wherein the light emitting element array and the drive device are electrically and mechanically connected to each other with a plurality of microbumps, in a case where the light emitting element array is not connected, an operating voltage of the light emitting elements of all the channels is generated in a pseudo-manner by bringing the plurality of shunt switches into conduction, the drive circuit includes a control section that generates a selection for selecting whether or not light is to be emitted from the channels, and the detection circuit includes an exclusive OR circuit that compares the selection signal transmitted from the control section with an output signal of each of the channels, the output signal being generated on a basis of the operating voltage of the light emitting elements.

7. The light emitting device according to claim 6, wherein the light emitting element array includes a Vertical Cavity Surface Emitting Laser (VCSEL).

* * * * *